(12) United States Patent
Okabe

(10) Patent No.: US 11,315,612 B2
(45) Date of Patent: Apr. 26, 2022

(54) SEMICONDUCTOR STORING APPARATUS AND PRE-CHARGE METHOD

(71) Applicant: Winbond Electronics Corp., Taichung (TW)

(72) Inventor: Sho Okabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/216,713

(22) Filed: Mar. 30, 2021

(65) Prior Publication Data

US 2021/0312957 A1 Oct. 7, 2021

(30) Foreign Application Priority Data

Apr. 3, 2020 (JP) .............................. JP2020-067352

(51) Int. Cl.
| | | |
|---|---|---|
| G11C 7/12 | (2006.01) | |
| G11C 7/10 | (2006.01) | |
| G11C 5/14 | (2006.01) | |
| G11C 16/04 | (2006.01) | |
| G11C 16/32 | (2006.01) | |
| G11C 7/22 | (2006.01) | |

(52) U.S. Cl.
CPC .............. G11C 7/1048 (2013.01); G11C 5/14 (2013.01); G11C 7/12 (2013.01); G11C 7/222 (2013.01); G11C 16/0433 (2013.01); G11C 16/32 (2013.01)

(58) Field of Classification Search
CPC ........... G11C 7/1048; G11C 5/14; G11C 7/12; G11C 7/222; G11C 16/0433; G11C 16/32; G11C 7/18; G11C 16/24; G11C 16/26; G11C 16/30; G11C 16/0483

See application file for complete search history.

(56) References Cited

U.S. PATENT DOCUMENTS 8,525,574 B1 * 9/2013 Duggal .................. G11C 27/02
327/390
10,141,036 B2 * 11/2018 Yamauchi ................ G11C 7/12
(Continued)

FOREIGN PATENT DOCUMENTS

| JP | H11176177 | 7/1999 |
|---|---|---|
| JP | 6164713 | 7/2017 |

(Continued)

OTHER PUBLICATIONS

"Office Action of Taiwan Counterpart Application", dated Sep. 29, 2020, p. 1-p. 8.

Primary Examiner — Jay W. Radke
(74) Attorney, Agent, or Firm — JCIPRNET

(57) ABSTRACT

A semiconductor storing apparatus capable of suppressing a peak current in a pre-charge operation and shortening a sense time is provided. A pre-charge method of a bit line of an NAND type flash memory includes: turning on a transistor (BLPRE) and supplying a pre-charge voltage to a sense node (SNS) at time (t1); turning on a transistor (BLCLAMP) connected to the sense node (SNS) and used for generating a clamp voltage and turning on a transistor (BLCN) connected to a node (BLS) at time (t2), turning on a transistor (BLSe/BLSo) connected between the node (BLS) and a bit line (GBLe/GBLo) at time (t3), and performing the pre-charge operation on the bit line.

15 Claims, 6 Drawing Sheets

(56) References Cited

U.S. PATENT DOCUMENTS

| | | | | |
|---|---|---|---|---|
| 2017/0206973 A1* | 7/2017 | Sudo | .................. | G11C 16/10 |
| 2018/0061464 A1* | 3/2018 | Yamauchi | .............. | G11C 16/24 |
| 2020/0395054 A1* | 12/2020 | Okabe | .................. | G11C 7/02 |

FOREIGN PATENT DOCUMENTS

| | | | | |
|---|---|---|---|---|
| JP | 2021163511 A | * | 10/2021 | ......... G11C 16/0433 |
| TW | 201820339 | | 6/2018 | |

* cited by examiner

| | Pre-charging step |
|---|---|
| 1 | SNS: Vcc-Vth |
| 2 | TOBL: VCLAMP2 or Vcc-Vth |
| 3 | BLS: VCLAMP2 or Vcc-Vth |
| 4 | GBL: VCLAMP2 or Vcc-Vth |
| 5 | GBL: VCLAMP1 or Vcc-Vth |
| 6 | SNS: Vcc, TOBL/BLS/GBL: VCLAMP1 |

SEMICONDUCTOR STORING APPARATUS AND PRE-CHARGE METHOD

CROSS-REFERENCE TO RELATED APPLICATION

This application claims the priority benefit of Japan application serial no. 2020-067352, filed on Apr. 3, 2020. The entirety of the above-mentioned patent application is hereby incorporated by reference herein and made a part of this specification.

TECHNICAL FIELD

The invention relates to a semiconductor storing apparatus such as a flash memory, and more particularly, to a pre-charge method of a bit line.

BACKGROUND

In a sense operation of an NAND flash memory, so-called shield sensing is performed in which pages of even bit lines or pages of odd bit lines are alternately sensed to reduce noise due to a capacitive coupling between adjacent bit lines (e.g., Patent Document 1). Also, in order to suppress a peak current during a pre-charging of the bit line in the sense operation, a method of dividing a pre-charging of a sense node into a plurality of times and a pre-charging of a selected bit line into a plurality of times is disclosed in Patent Document 2.

PRIOR ART DOCUMENT

Patent Document

Patent Document 1: Japanese Patent Laid-Open Publication No. 11-176177
Patent Document 2: Japanese Patent Publication No. 6164713

SUMMARY

FIG. 1A is a diagram showing an overall configuration of a page buffer/sense circuit of an NAND flash memory. As shown in the drawing, one page buffer/sense circuit is shared by one even bit line GBLe and one odd bit line GBLo. A page buffer/sense circuit 10 includes n page buffer/sense circuits 10_1, 10_2, ..., 10_n (n is 32K, for example) of one page.

FIG. 1B shows a configuration of one page buffer/sense circuit and a bit line select circuit connected thereto. The page buffer/sense circuit 10_1 includes: a sense circuit 20, reading data read onto the bit line, or setting a voltage corresponding to data "0" or "1" to be programmed to the bit line; and a latch circuit 30, holding the read data or to-be-programmed data.

Here, for convenience, signals applied to gates are also used to the identification of transistors. Further, all the transistors are N-channel Metal Oxide Semiconductor (NMOS) transistors. The sense circuit 20 includes: a transistor BLPRE, connected between a voltage supply node V1 and a sense node SNS, and supplying a pre-charge voltage to the sense node SNS; a transistor BLCLAMP, generating a clamp voltage at a node TOBL; and a transistor BLCN, connected between the node TOBL and a node BLS of a bit line select circuit 40. The sense node SNS of the sense circuit 20 is connected to the latch circuit 30 by a transistor for transmitting charges. Further, the transistor BLCN is connected to the node BLS of the bit line select circuit 40.

The bit line select circuit 40 includes a transistor BLSe for selecting the even bit line GBLe, a transistor BLSo for selecting the even bit line GBLo, a transistor YBLe for connecting a virtual power VIRPWR to the even bit line GBLe, and a transistor YBLo for connecting the virtual power VIRPWR to the odd bit line GBL_o. An NAND string (not shown) is connected to each of the even bit line GBLe and the odd bit line GBLo.

Operations of the sense circuit 20 and the bit line select circuit 40 are controlled according to page buffer control signals (signals such as BLPRE, BLCLAMP, BLCN, BLSe/o and YBLe/o in FIG. 1B) generated by a page buffer control 12.

FIG. 2A and FIG. 2B show a sequence of a conventional pre-charge operation of the bit line (Patent Document 2), and show voltage waveforms of respective parts of the page buffer/sense circuit. Here, it is assumed that the even bit line is selected by the bit line select circuit 40.

Time t1: The power supply node V1 is transitioned from GND to Vcc (e.g., 1.8V).

Time t2: Vcc is applied to a gate of the transistor BLPRE; the sense node SNS is pre-charged to Vcc-Vth (Vth is threshold of the transistor BLPRE).

Time t3: The transistor YBLe is turned off, and the even bit line GBLe is separated from the virtual power WIRPWR.

Time t4: VCLAMP2+Vth is applied to a gate of the transistor BLCLAMP; a voltage smaller than any one of VCLAMP2 or Vcc-Vth is generated at the node TOBL (Vth is a threshold of the transistor BLCLAMP).

Time t5: A voltage higher than Vcc (e.g., 5V) is applied to a gate of the transistor BLCN; the node TOBL is connected to the node BLS of the bit line select circuit 40. The transistor BLCN is strongly turned on, and the node BLS is pre-charged by a voltage smaller than any one of VCLAMP2 or Vcc-Vth which is substantially equal to that of the node TOBL.

Time t6: A voltage higher than Vcc (e.g., 5V) is applied to a gate of the transistor BLSe; the node BLS is connected to the selected bit line GBLe; the pre-charging of the selected bit line GBLe starts by a voltage smaller than any one of VCLAMP2 or Vcc-Vth.

Time t7: VCLAMP1+Vth is applied to transistor BLCLAMP; a voltage smaller than any one of VCLAMP1 or Vcc-Vth is generated at the node TOBL. There is a relationship of VCLAMP1>VCLAMP2. At this time, a pre-charge potential Vcc-Vth of the sense node SNS is supplied through the transistor BLCLAMP to the node TOBL, the node BLS and the selected bit line GBL_e, which are then pre-charged to a voltage smaller than any one of VCLAMP1 or Vcc-Vth.

Time t8: A voltage higher than Vcc (e.g., 4V) is applied to a gate of the transistor BLPRE; the transistor BLPRE is strongly turned on; the voltage of the sense node SNS is boosted to Vcc. There is a relationship of Vcc>VCLAMP1. Thus, finally, the node TOBL to the selected bit line GBLe are pre-charged to the target (VCLAMP1).

As described above, the conventional pre-charge method has an advantage that the peak current can be suppressed by turning on the transistors one by one to prevent multiple transistors from turning on at the same time. But on the other hand, there are the following problems. It takes more time to perform the sense operation since the time (time t6) becomes longer until the start of pre-charging of the bit line. Further, in an NAND flash memory equipped with a SPI (Serial Peripheral Interface) function, a sense time of the memory array needs to be shortened to meet a certain specification if the page is continuously sense at high speed in synchronization with the external serial clock signal.

The invention aims to solve the conventional problems by providing a semiconductor storing apparatus capable of suppressing the peak current in the pre-charge operation and shortening the sense time.

Technical Means for Solving the Problem

A pre-charge method of a bit line of an NAND type flash memory includes: at a first timing, turning on a first transistor used for applying a pre-charge voltage to a sense node by a first control signal; at a second timing, turning on a second transistor connected to the sense node and used for generating a clamping voltage by a second control signal, and turning on a third transistor connected between the second transistor and a node at a bit line side by a third control signal, at a third timing, turning on a fourth transistor connected between the node and a bit line.

In an embodiment, the pre-charge method further includes: at the first timing, transitioning a voltage supply node connected to the first transistor from a GND voltage level to a supply voltage level. In an embodiment, the pre-charge method further includes at a fourth timing after the third timing, a driving capability of the supply voltage level is switched from a low driving capability to a high driving capability. In an embodiment, at the first timing, turning off a fifth transistor connected between the bit line and a virtual power by a fifth control signal. In an embodiment, at the first timing, turning on a bit line side transistor of an NAND string. In an embodiment, the first control signal to the fourth control signal are driven to an H level when turning on the first transistor to the fourth transistor.

A semiconductor storing apparatus of the invention includes: an NAND type memory cell array; a page buffer/sense circuit, connected to the memory cell array; a bit line select circuit, connected to the page buffer/sense circuit; and a sense component, sensing a selected page of the memory cell array. The page buffer/sense circuit includes a voltage supply node, a first transistor connected between the voltage supply node and a sense node, a second transistor connected to the sense node and used for generating a clamp voltage, and a third transistor connected between the second transistor and a node of the bit line select circuit. The bit line select circuit includes a fourth transistor connected between the node and a bit line. The sense component turns on the first transistor by a first control signal at a first timing, turns on the second transistor and the third transistor by a second control signal and a third control signal at a second timing, and turns on a fourth transistor by a fourth control signal at a third timing.

In an embodiment, the sense component makes the voltage supply node transition from a ground voltage level to a supply voltage level at the first timing. In an embodiment, the sense component switches a driving capability of the supply voltage level from a low driving capability to a high driving capability at a fourth timing after the third timing. In an embodiment, the bit line select circuit includes a fifth transistor connected between an even bit line and a virtual power and a sixth transistor connected between an odd bit line and the virtual power, and the sense component turns off the fifth or the sixth transistor by the fifth control signal or the sixth control signal at the first timing to cut off a connection between a selected bit line and the virtual power. In an embodiment, the sense component turns on a bit line side transistor of an NAND string by a selected gate line at the first timing. In an embodiment, the semiconductor storing apparatus further includes an internal voltage generating component, The internal voltage generating component includes: an internal voltage generating circuit, generating an internal power voltage based on an external power voltage; a charge pump, generating a high voltage based on the external power voltage; and a regulator, generating a voltage regulated based on the high voltage generated by the charge pump. The sense component uses the voltage generated by the regulator to generate the first control signal, the third control signal and the fourth control signal, and uses the internal power voltage to generate a supply voltage of the voltage supply node. In an embodiment, the internal voltage generating component includes: another charge pump, generating a high voltage based on the external power voltage; and another regulator, generating a voltage regulated based on the high voltage generated by the another charge pump, the second control signal being generated by using the voltage generated the another regulator. In an embodiment, based on a control from the sense component, the internal power voltage generating circuit selectively generates the internal power voltage with a high driving capability or the internal power voltage with a low driving capability. In an embodiment, the sense component uses the high voltage generated by the charge pump to generate the selected gate signal.

Effect of the Invention

According to the invention, the bit line is pre-charged by turning on the first transistor to the fourth transistor by the first control signal to the fourth control signal from the first timing to the third timing, therefore, not only the peak current during the pre-charge operation can be suppressed, but the time until the pre-charging of the bit line starts can also be shortened. Accordingly, the sense time can be shortened. Further, since the first control signal, the third control signal and fourth control signal are not simultaneously driven to the H level and the voltage is not pre-charged from the voltage supply node to the bit line at the same time, the peak current due to the pre-charging may be suppressed.

DETAILED DESCRIPTION

Next, embodiments of the invention are described as follows. A semiconductor storing apparatus of the invention includes an NAND type flash memory. Here, the included NAND type flash memory may be in any form, and besides the NAND flash memory, the semiconductor storing apparatus may also include, other volatile memories (e.g., DRAM (Dynamic Random Access Memory), SRAM (Static Random Access Memory), a logic, a DSP (Digital Signal Processor), a CPU (Central Processing Unit), etc.

EMBODIMENTS

Figure 3:
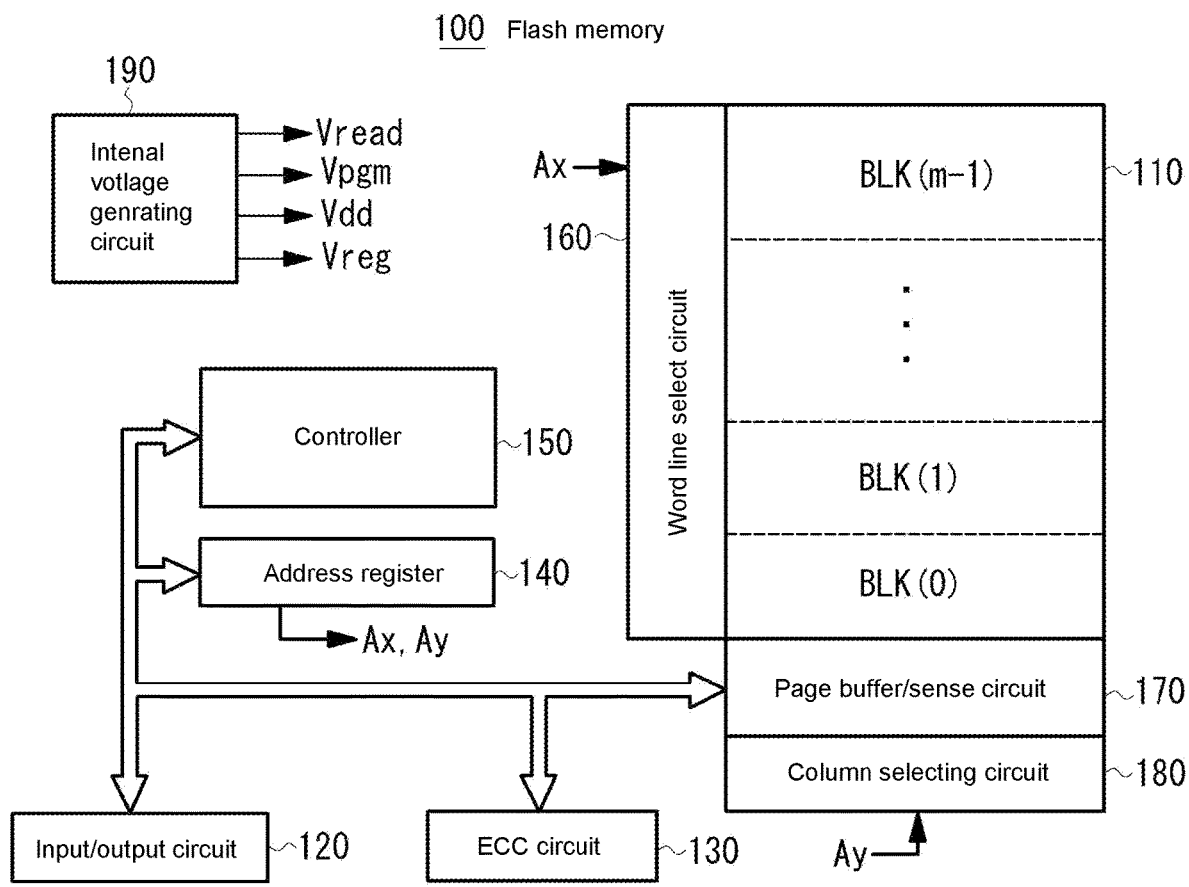
FIG. 3 is a diagram showing a configuration of an NAND flash memory according to an embodiment of the invention.

FIG. 3 is a diagram showing a configuration of an NAND flash memory according to an embodiment of the invention. A flash memory 100 of the present embodiment is constituted by including: a memory array 110, formed by a plurality of memory cells arranged in an array; an input/output circuit 120, connected to an external input/output terminal I/O; an ECC circuit 130, performing an error checking/correcting on data to be programmed in the memory cell array 110 and data read to be read therefrom; an address register 140, receiving address data from the input/output buffer 120; a controller 150, controlling reading, programming, erasing and the like based on commands or control signals from an external host device; a word line select circuit 160, performing a decoding operation on row address information Ax from the address register 140, and performing a block selection and a word line selection based on the decoding result; a page buffer/sense circuit 170, holding data read from a page selected by the word line select circuit 160, or holding data to be programmed into the selected page; a column select circuit 180, decoding column address information Ay from the address register 140, and selecting a column in the page buffer/sense circuit 170 based on the decoding result; and an internal voltage generating circuit 190, generating various voltages (a read voltage Vread, a program voltage Vpgm, an internal power voltage Vdd, a regulator voltage Vreg, etc.) required for reading, programming and erasing.

Figure 4:
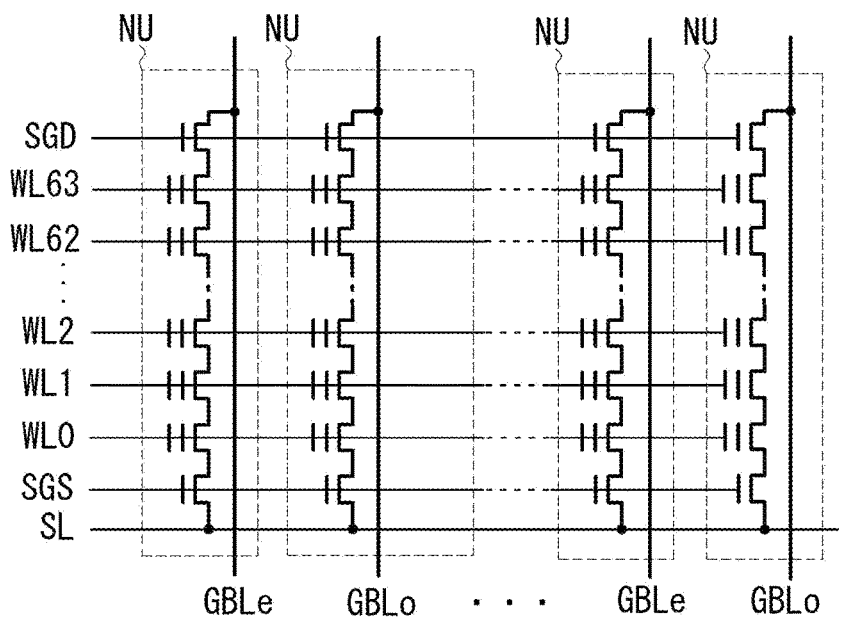
FIG. 4 is a diagram showing NAND string cells of an NAND flash memory.

The memory cell array 110 include m blocks BLK(0), BLK(1), ..., and BLK(m−1). In one block, as shown in FIG. 4, a plurality of NAND strings NU are formed, and the NAND strings NU are formed by a plurality of memory cells connected in series. One NAND string NU includes the memory cells (64 in the drawing), a bit line side select transistor and a source line side select transistor. The bit line side select transistor connects the memory cells to the bit line based on a select gate signal SGD applied to the gate. The source line side select transistor connects the memory cells to a source line SL based on a select source signal SGS applied to the gate. In the drawing, the NAND strings NU of two pages are formed in one block. An even-numbered NAND string NU is connected to the even bit line GBLe, and an odd-numbered NAND string NU is connected to the odd bit line GBLo.

The memory cell array 110 may be formed two-dimensionally on a surface of a substrate or formed three-dimensionally from the surface of the substrate in the vertical direction. Further, the memory cell may be a SLC (Single Level Cell) type for storing one bit (binary data) and may also be an MLC (Multi Level Cell) type for storing multiple bits.

The ECC circuit 130 may be set as enabled or disabled by commands or factory settings. When the ECC circuit 130 is enabled, the ECC circuit 130 performs the error checking/correcting on the data read from the memory array 110 or performs the error checking/correcting on the data to be programmed in the memory cell array 110.

The controller 150 a state machine or a microcontroller for controlling various operations of the flash memory. In the sense operation, a specific positive voltage is applied to the bit line; a specific voltage (e.g., 0V) is applied to a selected word line; a pass voltage is applied to a non-selected word line; a positive voltage is applied to the select gate signal SGD and the select gate signal SGS; 0V is applied to the source line. In a program operation, the program voltage Vpgm of high voltage is applied to the selected word line; an intermediate potential (e.g., 10 V) is applied to the non-selected word line to turn on the bit line side select transistor, turn off the source line side select transistor, and supply a potential corresponding to data of "0" or "1" to the bit line. In an erase operation, 0V is applied to all the selected word lines in the block; an erase voltage of high voltage is applied to a P-well; electrons of the floating gate to are extracted a substrate; the data is erased using block as a unit.

Figure 1A:
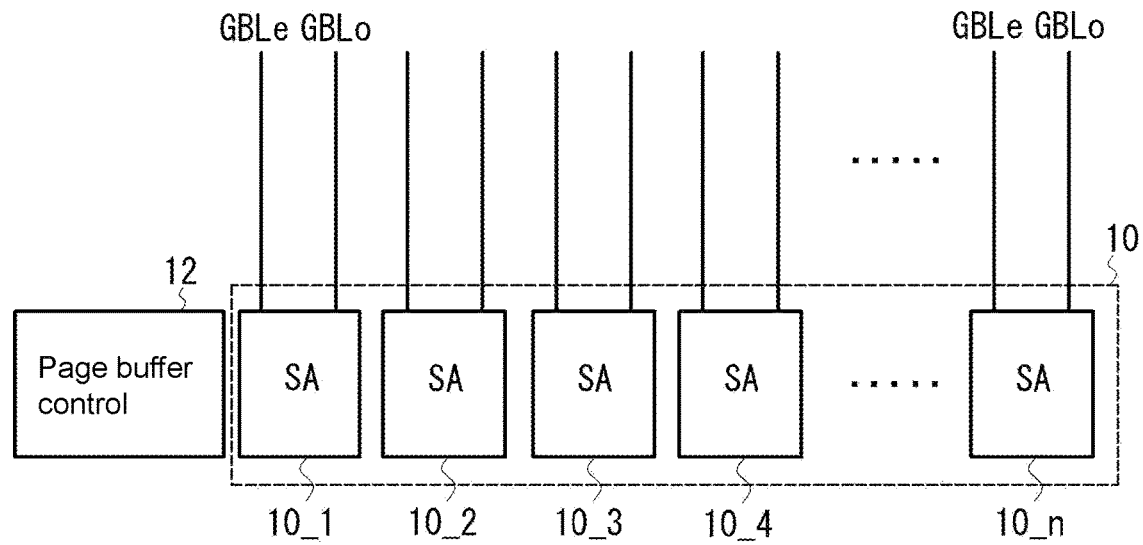
FIG. 1A is a diagram showing an overall configuration of the page buffer/sense circuit.
Figure 1B:
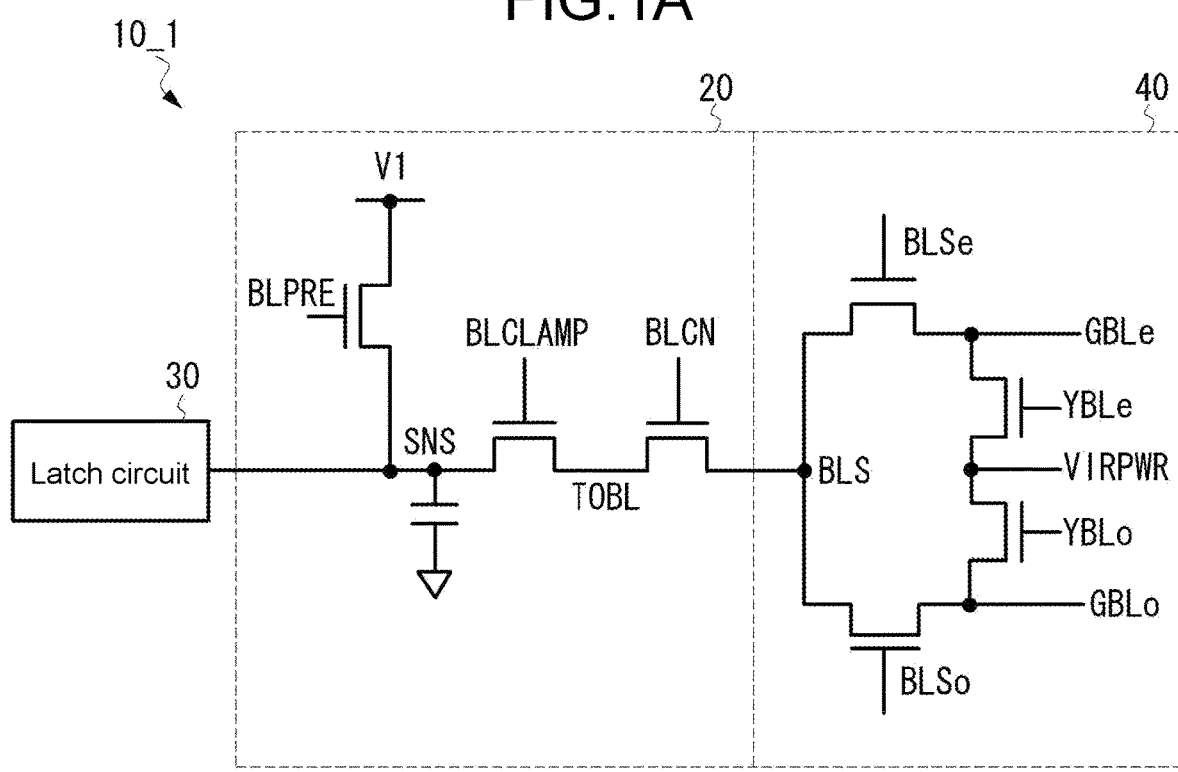
FIG. 1B is a diagram showing a configuration of one page buffer/sense circuit and a bit line select circuit connected thereto.

As shown in FIG. 1A and FIG. 1B, the page buffer/sense circuit 170 includes the sense circuit 20 and the latch circuit 30. One page buffer/sense circuit 170 is shared by the even bit line and the odd bit line through the bit line select circuit 40. Therefore, the page buffer/sense circuit 170 has the number of one page (e.g., 32K). The page buffer/sense circuit 170 or the bit line select circuit 40 is controlled based on the page buffer control signals generated by the page buffer control 12 shown in FIG. 1A and FIG. 1B.

Figure 5:
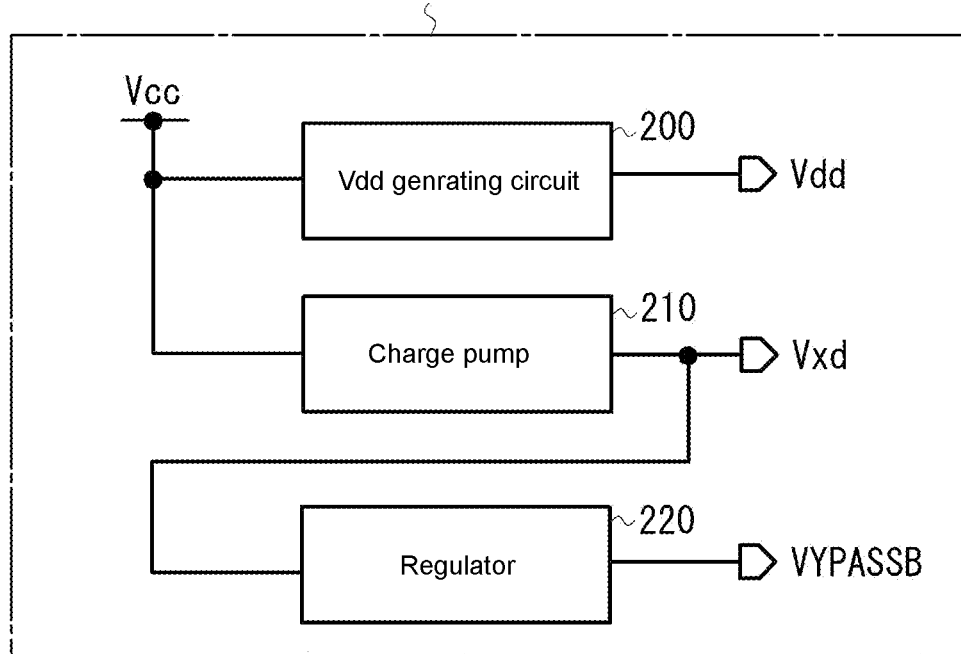
FIG. 5 is diagram showing a configuration of an internal voltage generating circuit in an embodiment of the invention.

As described above, the internal voltage generating circuit 190 generates various voltages required for the sense operation, the program operation and the erase operation. For the voltages to be used in the sense operation, the internal voltage generating circuit 190 includes a Vdd generating circuit 200, a charge pump 210, and a regulator 210 as shown in FIG. 5.

The Vdd generating circuit 200 uses an external power voltage Vcc to generate the internal power voltage Vdd. The external power voltage Vcc is, for example, 3.3V; the internal power voltage Vdd is, for example, 1.8V. The internal power voltage Vdd is, for example, a voltage used by the voltage supply node V1 of the page buffer/sense circuit 170 or the virtual power VIRPWR.

The charge pump 210 uses the external power voltage Vcc to generate a high voltage Vxd. The high voltage is, for example, 5.4V. The high voltage Vxd is used by a regulator or a level shifter for generating the select gate signal SGD of the bit line side select transistor or the select gate signal SGS of the source line side select transistor.

The regulator 220 uses the high voltage Vxd generated by the charge pump 210 to generate a voltage VYPASSB. The voltage VYPASSB is, for example, 4.4V. The voltage VYPSSB is used to control the page buffer control signals (BLPRE, BLCN, BLSe/BLSo, YBLe/YBLo, etc.) of the page buffer/sense circuit 170.

Figure 6:
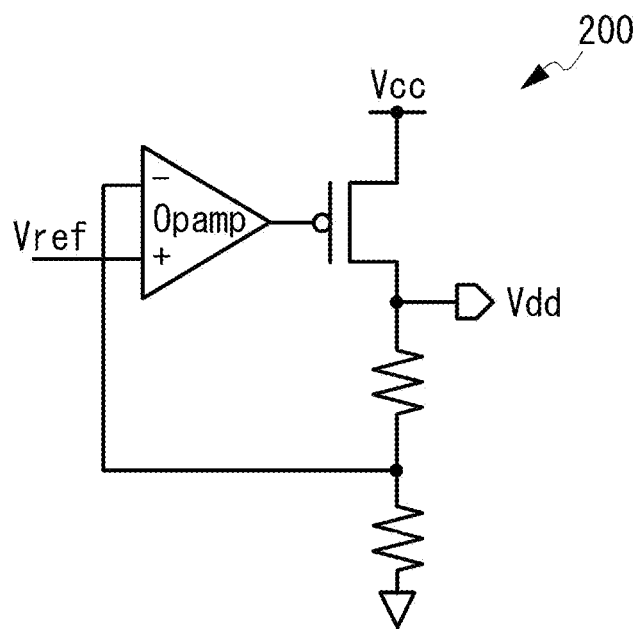
FIG. 6 diagram showing a configuration of a Vdd generating circuit in an embodiment of the invention.

FIG. 6 shows an example of the Vdd generating circuit 200. The Vdd generating circuit 200 includes a PMOS transistor and a resistance divider connected in series to a current path between the external power voltage Vcc and GND, and further includes an operational amplifier. The operational amplifier compares a voltage of the node divided by the resistance divider with a reference voltage Vref, and controls the PMOS transistor based on the comparison result. An output terminal outputs the internal power voltage Vdd for reducing the external power voltage Vcc. The internal power voltage Vdd is supplied to a V1 driving circuit or a driving circuit of the virtual power VIRPWR.

Figure 7:
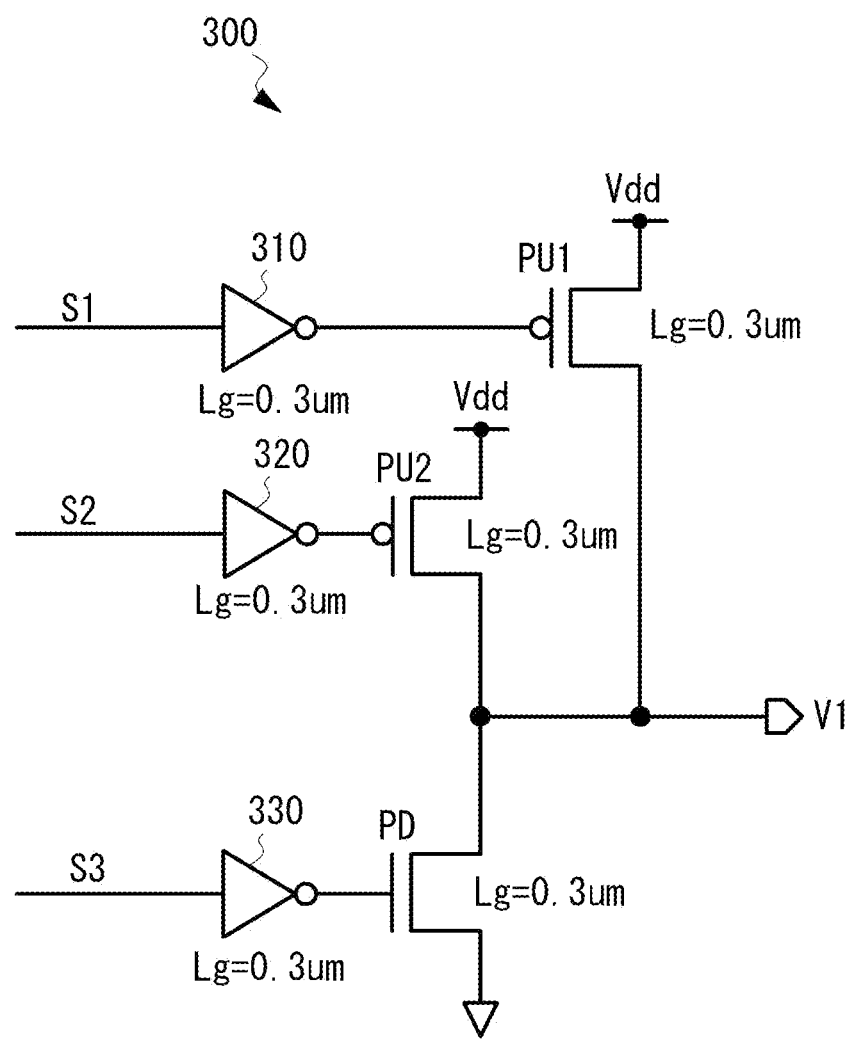
FIG. 7 is a diagram showing a configuration of a V1 driving circuit in an embodiment of the invention.

The configuration of the V1 driving circuit is shown in FIG. 7. A V1 driving circuit 300 is a circuit that drives the voltage supply node V1 of the page buffer/sense circuit 170. The V1 driving circuit 300 operates with the internal power voltage Vdd, and includes: P-type pull-up transistor PU1 and pull-up transistor PU2, connected in parallel between the internal power voltage Vdd and the output node V1; an N-type pull-down transistor PD, connected between the output node V1 and GND; and an inverter 310, an inverter 320 and an inverter 330, having outputs connected to each gate of the transistors PU1, PU2 and PD. A control signal S1, a control signal S2 and a control signal S3 from the controller 150 are input to the inverters 310, 320 and 330.

PMOS/NMOS transistors forming the pull-up transistor PU1, the pull-up transistor PU2, the pull-down transistor PD and the inverter 310, the inverter 320 and the inverter 330 are driven by a low voltage (e.g., 1.8 V) of the internal power voltage Vdd, where a breakdown voltage of the transistors is small and a gate length Lg is 0.3 μm.

Moreover, a driving ability of the pull-up transistor PU2 is configured to be stronger than a driving ability of the pull-up transistor PU1. That is, a W/L ratio of the pull-up transistor PU2 is greater than a W/L ratio of the pull-up transistor PU1, Therefore, a drain current flowing when the pull-up transistor PU2 is turned on is larger than a drain current flowing when the pull-up transistor PU1 is turned on.

When the control signal S1 is at an H level, the control signal S2 is at a L level and the control signal S3 is at the H level, the pull-up transistor PU1 is turned on; the pull-up transistor PU2 is turned off; the pull-down transistor PD is turned off; the voltage Vdd with a weak driving capability is generated at the output node V1. Further, when the control signal S1 is at the L level, the control signal S2 is at the H level and the control signal S3 is at the H level, the pull-up transistor PU1 is turned off; the pull-up transistor PU2 is turned on; the pull-down transistor PD is turned off; the voltage Vdd with a strong driving capability is generated at the output node V1. Alternatively, when the control signal S1 is at the H level, the control signal S2 is at the H level and the control signal S3 is at the H level, the pull-up transistor PU1 is turned on; the pull-up transistor PU2 is turned on; the pull-down transistor PD is turned off; a composite voltage of the voltage Vdd with the weak driving capability and the voltage Vdd with the strong driving capability is generated at the output node V1. When the control signal S1, the control signal S2 and the control signal S3 are at the L level, the pull-up transistor PU1 and the pull-up transistor PU2 are turned off; the pull-down transistor PD is turned off; a GND level is generated at the output node V1.

Next, the pre-charge operation of the bit line at the time of the sense operation/verify read in this embodiment will be described as follows. Because the number of the page buffer/sense circuits 170 is very large (one page is, for example, 32K), when the page buffer control signals (such as BLPRE, BLCN, BLSe/BLSo, YBLe/YBLo) are changed from the L level to the H level, a large current needs to be consumed in order to drive these control signals. In addition, since a capacitance of the sense node SNS and a capacitance of the bit line laid across the blocks are large, the current consumption becomes large when the bit line is pre-charged by the sense node SNS.

When the page buffer control signals are transitioned from L to H together, the voltage VYPASSB used by the page buffer control signals temporarily drops. Since the voltage VYPASSB uses the high voltage Vxd, the high voltage Vxd will also temporarily drop at the same time. Because the high voltage Vxd is used in the generation of the select gate signals SGS/SGS or the level shifter, if the voltage drop of the high voltage Vxd is too large, the level shifter may invert the output and cause a malfunction in the worst case. Moreover, if currents for pre-charging flow from the voltage supply node V1 to the bit line all at once, the internal power voltage Vdd temporarily drops. Worse yet, the external power voltage Vcc will temporarily drop, causing the operations of the flash memory to stack or reset. Therefore, ideally, the peak current is to be suppressed as much as possible when the bit line is pre-charged.

In this embodiment, from this point of view, there is one constraint regarding simultaneous switching of multiple page buffer control signals (transition from L to H or transition from H to L). This constraint is that when changing the page buffer control signals changed from L to H, the multiple page buffer control signals generated by the voltage VYPASSB are not to be switched simultaneously. That is, the three control signals including the control signal BLPRE, the control signal BLCN and the control signal BLSe/BLSo are not to be switched to the H level at the same time. If the three control signals are switched to the H level at the same time, the voltage VYPASSB will generate a large voltage drop. The reason for this is that a gate capacitance of the transistor of the page buffer/sense circuit 170 is large, and if there are as many as one page, a large amount of current needs to be consumed to drive them to the H level. In other words, when any one of these three control signals is switched to the H level, it is allowed to switch the other control signals at the same time. For example, it is allowed to switch the voltage supply node V1 to the H level, or to switch the control signal YBLe/YBLo to the L level, or to switch the control signal BLCLAMP to the H level.

Moreover, when any one of the three control signals is switched to the H level, it is also allowed to switch the select gate signals SGD/SGS at the same time. For example, the select gate signal SGD is driven to the H level. The select gate signal uses the high voltage Vxd generated by the charge pump 210. However, the bit line side select transistor or the source line side select transistor of the NAND string is the same small size as the memory cell. Therefore, the gate capacitances of these transistors are sufficiently smaller than those of the transistors of the page buffer/sense circuit 170 or the bit line select circuit 40. Therefore, the drop of the voltage Vxd due to the select gate line can be ignored even if it is simultaneous with the switching of the page buffer control signal.

Since the control signal BLCLAMP generates VCLAMP1 or VCLAMP2 at the node TOBL, a clamp voltage of VCLAMP1+Vth or VCLAMP2+Vth is applied to the gate. VCLAMP1+Vth and VCLAMP2+Vth may require a voltage level higher than Vcc. However, unlike the three control signals above, since it is a clamp voltage, it is expected that a constant voltage level is always maintained. For example, when VCLAMP1+Vth and VCLAMP2+Vth reduced from VYPASSB are generated by a regulator (not shown), the control signal BLCLAMP may temporarily drop due to the switching of the three control signals. Therefore, ideally, the clamp signal is to be generated by a reduction from a regulated voltage higher than Vcc and different from VYPASSB. For example, the voltage generating circuit 190 shown in FIG. 5 further include another charge pump different from the charge pump 210, and another regulator for regulating a high voltage generated by the another charge pump. The clamp voltage (VCLAMP1+Vth, VCLAMP2+

Vth) of the control signal BLCLAMP is generated using the voltage of the another regulator.

The pre-charge operation for the bit line in this embodiment of the invention is described below with reference to a sequence of FIG. 8A and FIG. 8B. Here, it is assumed that the even bit line is selected by the bit line select circuit.

Time t1: The power supply node V1 is transitioned from the GND level to the internal power voltage Vcc. The controller 150 causes the output node V1 of the V1 driving circuit 300 (see FIG. 7) to generate the internal power voltage Vdd (e.g., 1.8 V) with the weak driving capability by the control signal S1, the control signal S2 and the control signal S3. That is, the pull-up transistor PU1 is turned on, and the pull-up transistor PU2 and the pull-down transistor PD are turned off.

Further, at time t1, the control signal BLPRE is driven from the L level to the H level (e.g., 4.4V); the transistor BLPRE is turned on; the select gate signal SGD is driven from the L level to the H level (e.g., 4.5V); the bit line side select transistor is turned on. Furthermore, the control signal YBLe is transitioned from the H level to the L level; the transistor YBLe is turned off; the even bit line GBLe is cut off from the virtual power VIRPWR. In this way, the sense node SNS is charged by the internal power voltage Vdd. Since the internal power voltage Vdd with the weak driving ability is used, so a charging speed of this charging is relatively slow.

Time t2: The control signal BLCLAMP is driven from the L level to the H level (the voltage VCLAMP1+Vth); the transistor BLCLAMP is turned on; the control signal BLCN is driven from the L level to the H level (e.g., 4.4V); the transistor BLCN is turned on. There is a relationship of Vcc>VCLAMP1. In this way, the node TOBL and the node BLS are charged by the voltage of VCLAMP1. Vth is the threshold of the transistor BLCLAMP.

Time t3: The control signal BLSe is driven from the L level to the H level (e.g., 4.4V), and the transistor BLSe is turned on. Accordingly, the even bit line GBLe is connected to the node BLS and the pre-charging of the even bit line GBLe is started. Since the internal power voltage Vdd with the weak driving ability is used, so a charging speed of this charging is relatively slow.

Time t4: At time t4 after a lapse of a certain time from time t3, the internal power voltage Vdd supplied from the voltage supply node V1 is switched to the strong driving capability. The controller 150 causes the output node V1 of the V1 driving circuit 300 to generate the internal power voltage Vdd (for example, 1.8V) with the strong driving capability by the control signal S1, the control signal S2 and the control signal S3. For example, the pull-up transistor PU1 and the pull-up transistor PU2 are turned on, and the pull-down transistor PD is turned off. Accordingly, the even bit line GBLe is rapidly charged by the internal power voltage Vdd with the strong driving ability.

From time t1 to time t4, since the internal power voltage Vdd supplied from the voltage supply node V1 has the weak driving capacity, the node SNS may be initially charged only to a voltage lower than a target voltage (i.e., Vdd) at time t4. Similarly, the node TOBL, the node BLS and the even bit line GBLe may be initially charged only to a voltage lower than a target voltage (i.e., VCLAMP1). Since the internal power voltage Vdd supplied from the power supply node V1 is switched to the strong driving capability at time t4, the nodes SNS, TOBL, BLS and even bit lines GBLe are charged to the target voltage, respectively. Therefore, the target voltage is pre-charged while reducing the peak current due to the voltage supply node V1.

Figures 2A, 2B:
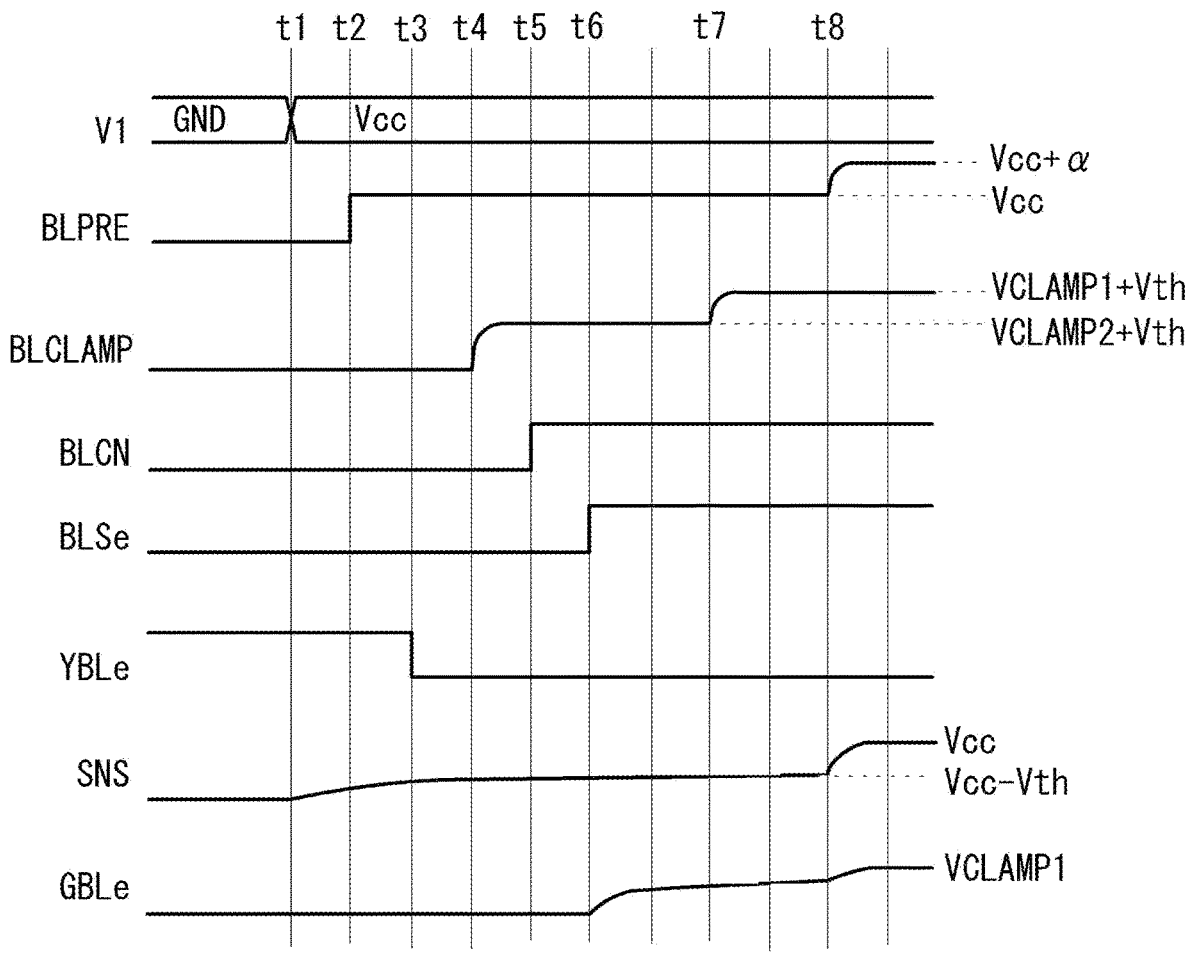
FIG. 2A is a sequence of a conventional pre-charge operation for the bit line.
FIG. 2B is a diagram showing 6 steps of the conventional pre-charge operation.
Figures 8A, 8B:
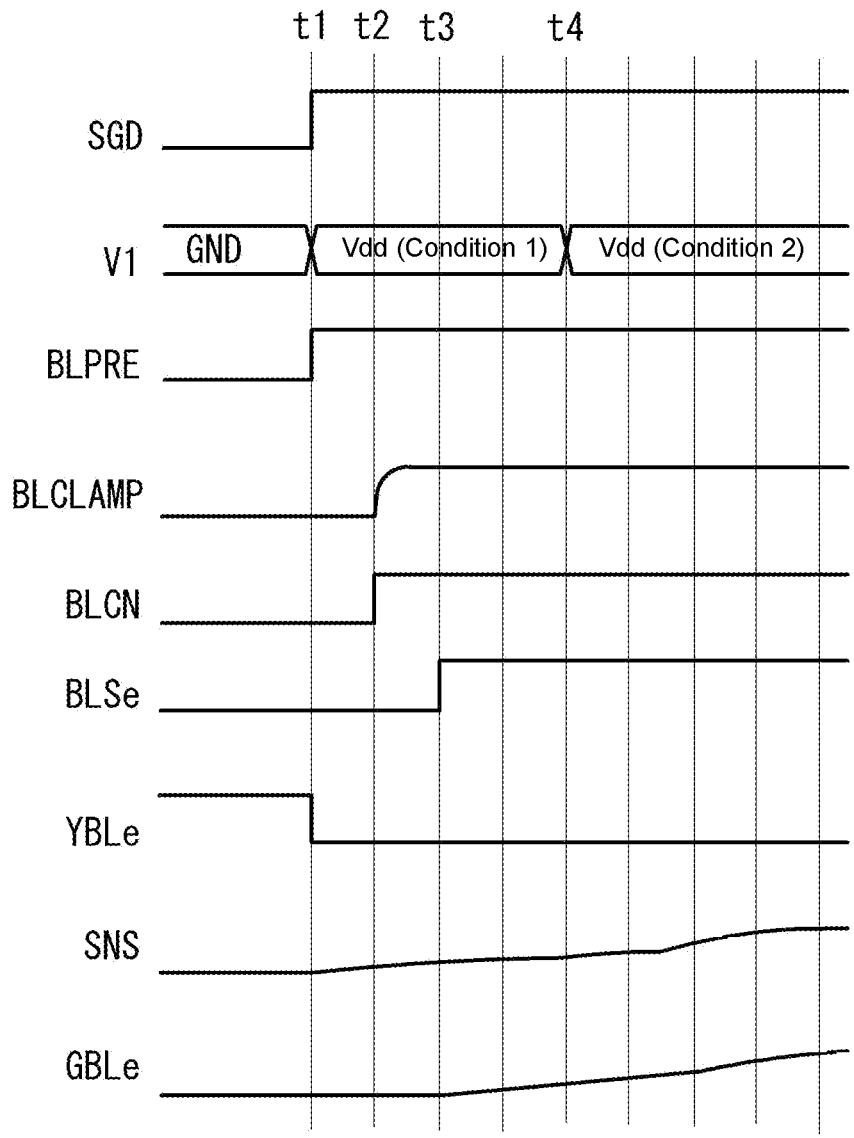
FIG. 8A is a sequence of a pre-charge operation of the bit line in an embodiment of the invention.
FIG. 8B is a diagram showing 4 steps of the pre-charge operation in an embodiment of the invention.

FIG. 8B shows 4 steps of the pre-charge method of this embodiment. Compared with 6 steps of the conventional pre-charge method in FIG. 2(B), it is known that, the time to start the pre-charging is t4 in this embodiment, and is time t6 in the conventional art. A start time of the pre-charging in this embodiment becomes earlier.

In the conventional pre-charge method, the clamp voltage is boosted from VCLAMP2 to VCLAMP1 in two steps, but VCLAMP1 is generated at one time in this embodiment. Two concerns arise regarding this. One is the peak current and the other is a pre-charge voltage level of the bit line.

Regarding the peak current, a maximum peak current occurs after the pre-charging is started on the sense node SNS or the bit line having a large capacitance. In the present embodiment, as described above, the internal power voltage Vdd supplied from the voltage supply node V1 has the weak driving capability from times t1 to time t4. That is, at time t1, the weak drive capability is used to initially charge the sense node SNS, initially charge the node BLS at time t2, and then initially charge the bit lines in sequence at time t3. Therefore, the peak current due to the generation of VCLAMP1 is not a big problem.

In addition, regarding the pre-charge voltage level of the bit line, if the voltages of the node SNS and the node TOBL change suddenly, the transistor BLCLAMP temporarily becomes unstable due to the coupling effect. Depending on PVT (process/voltage/temperature) conditions, the unstable transistor BLCLAMP may cause a larger pre-charge voltage level. However, in this embodiment, when VCLAMP1 is generated during time t1 to time t4, the internal power voltage Vdd with the weak driving capability is used to suppress the sudden voltage changes of the node SNS and the node TOBL. Further, after time t4, the internal power voltage Vdd with the strong driving capability is used. Since the node SNS and the node TOBL are initially charged, this phenomenon can be suppressed by further charging with a difference from the target voltage.

In this way, according to this embodiment, compared with the conventional pre-charge method, the time until the pre-charging starts can be shortened, and the peak current can be suppressed. Furthermore, the generation of unnecessary pre-charge voltage levels is suppressed.

The pre-charge method of this embodiment is also applied to the verify read during the normal read operation or program operation. Furthermore, the pre-charge method of this embodiment can also be applied to the operation of continuously reading pages in synchronization with the external serial clock signal.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. A pre-charge method of a bit line of a NAND type flash memory, the pre-charge method comprising:
   at a first timing, turning on a first transistor used for applying a pre-charge voltage to a sense node by a first control signal;
   at a second timing, turning on a second transistor connected to the sense node and used for generating a clamping voltage by a second control signal, and turning on a third transistor connected between the second transistor and a node at a bit line side by a third control signal, wherein the second control signal and the third control signal are generated by separate regulators, respectively; and at a third timing, turning on a fourth transistor connected between the node and a bit line, wherein the first through third timings are different from each other.

2. The pre-charge method of claim 1, wherein
the pre-charge method further comprises: at the first timing, transitioning a voltage supply node connected to the first transistor from a ground voltage level to a supply voltage level.

3. The pre-charge method of claim 1, wherein
the pre-charge method further comprises
at a fourth timing after the third timing, switching a driving capability of the supply voltage level from a low driving capability to a high driving capability.

4. The pre-charge method of claim 1, wherein
at the first timing, turning off a fifth transistor connected between the bit line and a virtual power by a fifth control signal.

5. The pre-charge method of claim 1, wherein at the first timing, turning on a bit line side transistor of a NAND string.

6. The pre-charge method of claim 1, wherein
the first control signal to the fourth control signal are driven to an H level when turning on the first transistor to the fourth transistor.

7. A semiconductor storing apparatus, comprising:
a NAND type memory cell array;
a page buffer/sense circuit, connected to the memory cell array;
a bit line select circuit, connected to the page buffer/sense circuit; and
a sense component, sensing a selected page of the memory cell array,
wherein the page buffer/sense circuit comprises a voltage supply node, a first transistor connected between the voltage supply node and a sense node, a second transistor connected to the sense node and used for generating a clamp voltage, and a third transistor connected between the second transistor and a node of the bit line select circuit,
wherein the bit line select circuit comprises a fourth transistor connected between the node and a bit line,
wherein the sense component turns on the first transistor by a first control signal at a first timing, turns on the second transistor and the third transistor by a second control signal and a third control signal, respectively, at a second timing, and turns on a fourth transistor by a fourth control signal at a third timing, and
wherein the second control signal and the third control signal are generated by separate regulators, respectively, and the first through third timings are different from each other.

8. The semiconductor storing apparatus of claim 7, wherein
the sense component transitions the voltage supply node from a ground voltage level to a supply voltage level at the first timing.

9. The semiconductor storing apparatus of claim 7, wherein
the sense component switches a driving capability of the supply voltage level from a low driving capability to a high driving capability at a fourth timing after the third timing.

10. The semiconductor storing apparatus of claim 7, wherein
the bit line select circuit comprises a fifth transistor connected between an even bit line and a virtual power and a sixth transistor connected between an odd bit line and the virtual power, and
the sense component turns off the fifth or the sixth transistor by the fifth control signal or the sixth control signal at the first timing to cut off a connection between a selected bit line and the virtual power.

11. The semiconductor storing apparatus of claim 7, wherein
the sense component turns on a bit line side transistor of a NAND string by a selected gate line at the first timing.

12. The semiconductor storing apparatus of claim 7, wherein
the semiconductor storing apparatus further comprises an internal voltage generating component, and
the internal voltage generating component comprises: an internal voltage generating circuit, generating an internal power voltage based on an external power voltage; a charge pump, generating a high voltage based on the external power voltage; and a regulator, generating a voltage regulated based on the high voltage generated by the charge pump,
wherein the sense component uses the voltage generated by the regulator to generate the first control signal, the third control signal and the fourth control signal, and uses the internal power voltage to generate a supply voltage of the voltage supply node.

13. The semiconductor storing apparatus of claim 7, wherein
the internal voltage generating component comprises: another charge pump, generating a high voltage based on the external power voltage; and another regulator, generating a voltage regulated based on the high voltage generated by the another charge pump, the second control signal being generated by using the voltage generated the another regulator.

14. The semiconductor storing apparatus of claim 12, wherein
based on a control from the sense component, the internal power voltage generating circuit selectively generates the internal power voltage with a high driving capability or the internal power voltage with a low driving capability.

15. The semiconductor storing apparatus of claim 11, wherein
the sense component uses the high voltage generated by the charge pump to generate the selected gate signal.

* * * * *